United States Patent
Yang et al.

(10) Patent No.: US 10,416,221 B2
(45) Date of Patent: Sep. 17, 2019

(54) VOLTAGE BASED METHOD FOR FAULT IDENTIFICATION IN A TRANSMISSION LINE APPARATUS THEREOF

(75) Inventors: Ying Yang, Beijing (CN); Youyi Li, Beijing (CN); G. Pradeep, Beijing (CN)

(73) Assignee: ABB Schweiz AG, Baden (CH)

( * ) Notice: Subject to any disclaimer, the term of this patent is extended or adjusted under 35 U.S.C. 154(b) by 1102 days.

(21) Appl. No.: 13/982,297

(22) PCT Filed: Mar. 17, 2011

(86) PCT No.: PCT/CN2011/071887
§ 371 (c)(1),
(2), (4) Date: Jul. 29, 2013

(87) PCT Pub. No.: WO2012/122711
PCT Pub. Date: Sep. 20, 2012

(65) Prior Publication Data
US 2013/0317768 A1    Nov. 28, 2013

(51) Int. Cl.
*G01R 31/00* (2006.01)
*G01R 31/02* (2006.01)
(Continued)

(52) U.S. Cl.
CPC .......... *G01R 31/025* (2013.01); *G01R 27/00* (2013.01); *G01R 31/021* (2013.01); *G01R 31/08* (2013.01);
(Continued)

(58) Field of Classification Search
CPC ................................................. G01R 31/025
See application file for complete search history.

(56) References Cited

U.S. PATENT DOCUMENTS

| 2,147,101 | A | * | 2/1939 | Leyburn | .................. | H02H 3/40 361/47 |
| 5,946,174 | A | | 8/1999 | Kaiser | | |

(Continued)

FOREIGN PATENT DOCUMENTS

| CN | 1625008 A | 6/2005 |
| CN | 101359822 A | 2/2009 |

(Continued)

OTHER PUBLICATIONS

English translation of CN101877479, Nov. 3, 2010.*
(Continued)

*Primary Examiner* — Michael P Nghiem
(74) *Attorney, Agent, or Firm* — J. Bruce Schelkopf; Taft Stettinius & Hollister LLP (57) ABSTRACT

The present invention provides a method for current for fault identification in a transmission line and an apparatus thereof. The method comprises the following steps: measuring the real-time values of the currents and the voltages of the other unbroken healthy phase conductors when a single-phase fault occurs; calculating the inductive voltage and the capacitive coupling voltage according to the measured currents and voltages respectively; comparing the capacitive coupling voltage with the inductive voltage multiplied by a factor, in which the multiplication result is used as a self-adjusted threshold based on the real time load condition of the transmission line; and identifying the fault type based on the maximum of the capacitive coupling voltage and the multiplication.

16 Claims, 4 Drawing Sheets

(51) Int. Cl.
*G01R 31/08* (2006.01)
*G01R 27/00* (2006.01)
*H02H 3/06* (2006.01)
*H02H 7/26* (2006.01)
*H02H 3/08* (2006.01)
*H02H 3/40* (2006.01)
*G06F 19/00* (2018.01)
*G01D 21/00* (2006.01)
*G06F 17/40* (2006.01)

(52) U.S. Cl.
CPC .............. *H02H 3/06* (2013.01); *H02H 3/083* (2013.01); *H02H 3/402* (2013.01); *H02H 3/405* (2013.01); *H02H 7/26* (2013.01); *G01D 21/00* (2013.01); *G06F 17/40* (2013.01); *G06F 19/00* (2013.01)

(56) References Cited

U.S. PATENT DOCUMENTS

| | | | | |
|---|---|---|---|---|
| 5,973,899 | A * | 10/1999 | Williams | H02H 3/063 361/65 |
| 7,298,149 | B2 * | 11/2007 | Saha | G01R 31/085 324/512 |
| 8,081,002 | B2 * | 12/2011 | Wahlroos | G01R 31/088 324/512 |
| 2005/0045460 | A1 * | 3/2005 | Rhein | H01H 31/00 200/200 |
| 2006/0097728 | A1 * | 5/2006 | Saha | G01R 31/085 324/525 |
| 2009/0267611 | A1 * | 10/2009 | Wahlroos | G01R 31/088 324/522 |
| 2011/0032650 | A1 * | 2/2011 | Hwan | H02H 3/066 361/71 |
| 2011/0085273 | A1 * | 4/2011 | Bengtsson | H02H 3/06 361/65 |
| 2011/0148430 | A1 * | 6/2011 | Yang | G01R 31/085 324/543 |
| 2012/0095707 | A1 * | 4/2012 | Li | G01R 31/085 702/58 |
| 2012/0113555 | A1 * | 5/2012 | Mousavi | H02H 3/066 361/78 |
| 2013/0218359 | A1 * | 8/2013 | Dadash Zadeh | H02H 3/063 700/294 |

FOREIGN PATENT DOCUMENTS

| | | | |
|---|---|---|---|
| CN | 101877479 | * | 11/2010 |
| CN | 101877479 | A | 11/2010 |
| CN | 101877480 | A | 11/2010 |
| WO | WO2010022559 | * | 3/2010 |
| WO | 2010148570 | A1 | 12/2010 |

OTHER PUBLICATIONS

ISA/CN International Search Report issued Dec. 15, 2011 re PCT Application No. PCT/CN2011/071887, filed Mar. 17, 2011.
Extended Search Report of European Patent Office issued Oct. 10, 2014 re Application No. 11861268.8 of ABB Technology Ltd.
First Office Action issued by Chinese Patent Office on Nov. 3, 2014 re application No. 201180069380.9 of ABB Technology Ltd.
Indian Patent Office, Examination Report for corresponding in Application No. 5355/CHENP/2013, dated Oct. 25, 2018, 5 pages.

* cited by examiner

VOLTAGE BASED METHOD FOR FAULT IDENTIFICATION IN A TRANSMISSION LINE APPARATUS THEREOF

RELATED APPLICATION

This application is a national filing of PCT application Serial No. PCT/CN2011/071887, filed Mar. 17, 2011.

FIELD OF THE INVENTION

The invention relates to the field of power transmission, and more particularly to a voltage based method for fault identification in a transmission line and apparatus thereof when the transmission line occurs a single-phase fault.

BACKGROUND OF THE INVENTION

For a transmission line, there generally exist two types of faults, i.e. a permanent fault and a temporary fault, in which about 90% of the faults are single-phase faults, and over 80% of the single-phase faults are temporary faults. Auto-reclosing the circuit breaker (CB) is a generally effective way to improve the stability and continuity of a power system. However, if a transmission line with a permanent fault is auto-reclosed, some risks may be arisen, for example the primary devices may be damaged, device insulation can be destroyed, the system stability may be threatened, and no continuous current can be supplied stably. So it is very important and desirable for customers to distinguish temporary faults from permanent faults in a transmission line.

At present, some methods have been proposed to distinguish these two kinds of faults to avoid auto-reclosing the CB in the case of permanent fault occurrence. Among them, the method based on the mutual voltage (i.e. capacitive coupling voltage) is extensively adopted, whose basic principle can be described as following.

Figure 1:
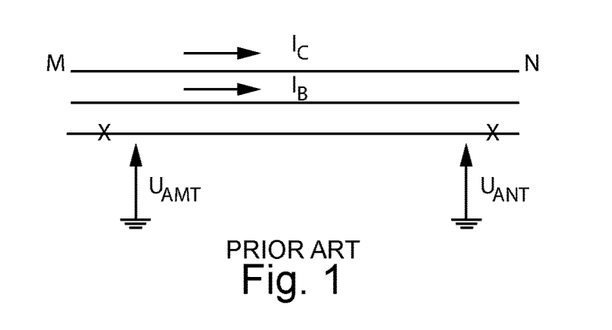
FIG. 1 illustrates a single-phase fault (opened phase A) occurs in a transmission.

FIG. 1 illustrates a single-phase fault (opened phase A) occurs in a transmission. In FIG. 1, for example, phase A is opened at both ends of the conductor. When the fault phase of the transmission line is isolated, the isolated phase conductor still possesses a voltage to the ground, i.e. a capacitive coupling voltage, and an inductive voltage from the other two unbroken healthy phase conductors (for example phase B and phase C).

The steady state voltage $U_y$ caused by capacitive coupling can be calculated according to the following equation (1):

$$U_y = \frac{b_0 - b_1}{2b_1 + b_0} \dot{U}_A. \quad (1)$$

In which $b_0$ and $b_1$ are the zero sequence and positive sequence capacitive susceptance per unit line length of the transmission line respectively; $\dot{U}_A$ represents phase A voltage vector.

The inductive voltage $U_{XL}$ on the opened phase A conductor can be calculated according to the following equation (2):

$$\dot{U}_{XL} = (\dot{I}_B + \dot{I}_C) Z_m L = (\dot{I}_B + \dot{I}_C)(Z_0 - Z_1) L/3 = \dot{U}_X L \quad (2)$$

in which $I_B$ and $I_C$ are the currents of the unbroken healthy phase conductors phase B and C respectively; $Z_0$ and $Z_1$ are the zero sequence and positive sequence impedance of the protected transmission line respectively; $Z_m$ is the mutual inductance impedance per unit line length; L is the length of the transmission line; $U_X$ represents inductive voltage per unit line length.

It's obvious to the skilled person that the capacitive coupling voltage $U_y$ is the voltage of phase A to ground, and independent of the line length and the load. While the inductive voltage $U_{XL}$ is longitudinal along the conductor and proportional to the load current and line length. Then the terminal voltage $U_{AMT}$ and $U_{ANT}$ magnitudes on the opened phase conductor can be calculated according to the following equation (3) and (4) respectively:

$$U_{AMT} = \sqrt{U_y^2 + (U_{XL}/2)^2 - U_y U_{XL} \cos(\theta + \pi/2)} \quad (3)$$

$$U_{ANT} = \sqrt{U_y^2 + (U_{XL}/2)^2 - U_y U_{XL} \cos(-\theta + \pi/2)} \quad (4).$$

In which θ is power factor and subscript 'T' means temporary fault.

Figure 2A:
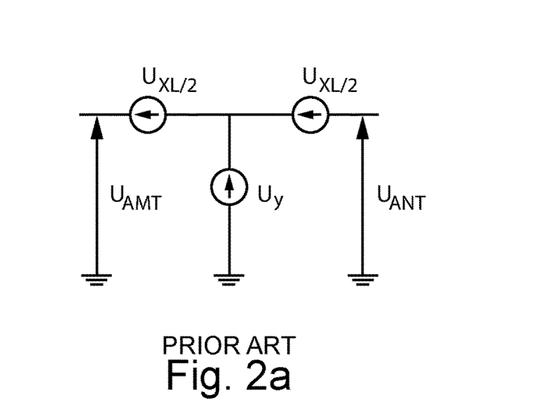
FIG. 2a illustrates an equivalent circuit diagram about the temporary fault voltage on the opened phase conductor terminals.
Figure 2B:
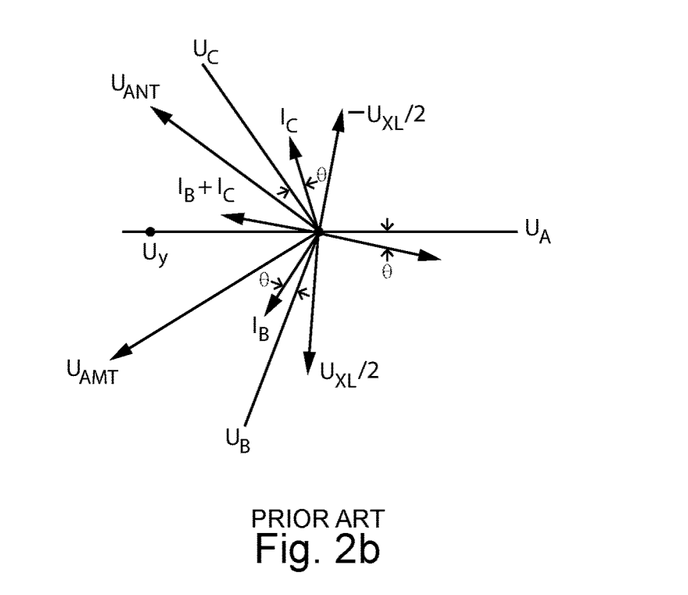
FIG. 2b illustrates the voltage vector diagram about the temporary fault voltage on the opened phase conductor terminals.

FIG. 2a illustrates an equivalent circuit diagram about the temporary fault voltage on the opened phase conductor terminals, and FIG. 2b illustrates the voltage vector diagram about the temporary fault voltage on the opened phase conductor terminals.

According to above principle, the distinguishing method based on the mutual voltage (i.e. capacitive coupling voltage) offers three criterions as below:

1) Voltage criterion (if $U_y \geq k_1 * U_{MXL}$):

$$U \geq K_1 U_{MXL} \quad (5).$$

In which U is the voltage value measured at the end of opened phase conductor; $K_1$ is a reliability coefficient; and $U_{MXL}$, is the inductive voltage $U_{MXL}$ at the maximum load condition.

This inequality (5) means that if the measured voltage U is above or equivalent to the predefined threshold, a transient fault can be determined.

2) Compensation voltage criterion (if $k_1 * U_{MXL} > U_y \geq k_1 * U_{MXL}/2$).

It will be obvious to the skilled person that the inductive voltage is dependent on the load current and length of the line from the equation (2). For a long transmission line with heavy load, previous voltage criterion 1 will represent an unsatisfied performance, that's to say, the criterion 1 cannot distinguish the fault; consequently a revised criterion 2-compensation criterion is described as follow:

$$\left| U - \frac{U_{MXL}}{2} \right| \geq \left| \frac{K_2 U_{MXL}}{2} \right|. \quad (6)$$

In which K2 is a reliability coefficient; and when this inequality (6) comes into existence in the case of a long transmission line with heavy load, the fault is determined as a transient fault.

3) Composed voltage criterion (if $k_1 * U_{MXL}/2 > U_y$):
The composed voltage criterion 3 can be described as follow:

$$\left| U - \frac{U_{MXL}}{4} \right| >= \left| \frac{K_3 U_{MXL}}{4} \right| \quad (7)$$

$$\left| U - \frac{3 * U_{MXL}}{4} \right| >= \left| \frac{K_3 U_{MXL}}{4} \right|.$$

In which $K_3$ is a reliability coefficient; and when these two inequalities are met simultaneously, the transient fault is identified.

According to the prior arts about the reclosing technique, existed solutions including above mentioned method generally represents good performance in distinguishing a permanent fault from a transient fault in the majority of operational conditions, but for some special conditions such as: the fault in a short transmission line, the fault with high fault resistance or the fault with heavy load, its performance will be degraded and the fault identification will be inaccurate even wrong. That means such drawback decreases the reliability of adaptive re-closure technique, and customers cannot be thoroughly convinced of utilizing this adaptive re-closure strategy to reclosing the CBs safely.

SUMMARY OF THE INVENTION

To overcome above mentioned shortcomings, the present invention provides a voltage based method for fault identification in a transmission line and apparatus thereof.

According to an embodiment of the present invention, a voltage based method for fault identification in a transmission line is provided. The method comprises: measuring the real-time values of the currents and the voltages of the other unbroken healthy phase conductors when a single-phase fault occurs; calculating the inductive voltage and the capacitive coupling voltage according to the measured currents and voltages respectively; comparing the capacitive coupling voltage with the inductive voltage multiplied by a factor, in which the multiplication result is used as a self-adjusted threshold based on the real time load condition of the transmission line; and identifying the fault type based on the maximum of the capacitive coupling voltage and the multiplication result.

According to a preferred embodiment of the present invention, if the capacitive coupling voltage is larger than the multiplication result, measuring the terminal voltage at the terminal of the opened phase conductor, selecting the maximum multiplication result between the inductive voltage multiplied by a second factor and the capacitive coupling voltage multiplied by a third factor, comparing the terminal voltage with the maximum; and identifying that the fault is a transient fault if the terminal voltage is larger than the maximum, otherwise the fault is a permanent fault.

According to a preferred embodiment of the present invention, if the capacitive coupling voltage is less than the multiplication result, said method further comprises the following steps: measuring the terminal voltage at the terminal of the opened phase conductor; selecting the maximum multiplication result between the inductive voltage multiplied by a forth factor and the capacitive coupling voltage multiplied by a fifth factor; comparing the terminal voltage subtracted half of the inductive voltage with the maximum multiplication result as well as the terminal voltage added half of the inductive voltage with the maximum multiplication result; and identifying that the fault is a transient fault if the subtraction result and the addition result are larger than the maximum multiplication result; otherwise the fault is a permanent fault.

According to a preferred embodiment of the present invention, in the case of phase A fault, said inductive voltage $U_X$ is calculated according to the measured currents $I_B$ and $I_C$ by the following equation:

$$U_X = \frac{(I_B + I_C) * (Z_0 - Z_1)}{3},$$

in which $I_B$ and $I_C$ are the currents of the unbroken healthy phase conductors phase B and C respectively, $Z_0$ and $Z_1$ are the zero sequence and positive sequence impedance of the protected transmission line respectively; and in the case of phase B fault or phase C fault, corresponding currents of the unbroken healthy phase conductors are measured and utilized to calculate the inductive voltage.

According to a preferred embodiment of the present invention, in case of phase A fault, said capacitive coupling voltage $U_M$ is calculated according to the measured voltages $U_B$ and $U_C$ by the following equation:

$$U_M = \frac{(U_B + U_C) * (b_1 - b_0)}{2 * b_1 + b_0},$$

in which $U_B$ and $U_C$ are the voltages of the unbroken healthy phase conductors phase B and C respectively, $b_0$ and $b_1$ are the zero sequence and positive sequence capacitive susceptance per unit line length of the transmission line respectively; and in the case of phase B fault or phase C fault, corresponding voltages of the unbroken healthy phase conductors are measured and utilized to calculate the capacitive coupling voltage.

According to a preferred embodiment of the present invention, said factors are on the basis of the length and the load of the transmission line.

According to a preferred embodiment of the present invention, said factors are dynamically adjusted on the basis of the length and the load of the transmission line.

According to a preferred embodiment of the present invention, said method can distinguish a permanent fault and a transient fault in the case of power flow direction conversion of the transmission line.

According to another embodiment of the present invention, an apparatus for fault identification in a transmission line is provided. Said apparatus comprises: a measurement unit, adapted configured to measure the real-time values of the currents and the voltages of the other unbroken healthy phase conductors when a single-phase fault occurs; and measure the terminal voltage $U_f$ at the terminal of the opened phase conductor; a calculation unit configured to calculate the inductive voltage and capacitive coupling voltage according to the measured currents and voltages respectively; a comparison unit configured to compare the capacitive coupling voltage with the inductive voltage multiplied by a factor, in which the multiplication result is used as a self-adjusted threshold based on the real time load condition of the transmission line; and an identification unit configured to identify that the fault type based on the maximum of the capacitive coupling voltage and the multiplication result.

According to a preferred embodiment of the present, the comparison unit is further configured to select the maximum multiplication result between the inductive voltage multiplied by a second factor and the capacitive coupling voltage multiplied by a third factor, and compare the terminal voltage with the maximum; and the identification unit is further configured to identify that the fault is a transient fault if the capacitive coupling voltage is larger than the multiplication result and the terminal voltage is larger than the maximum, or the fault is a permanent fault if the capacitive coupling voltage is larger than the multiplication result and the terminal voltage is less than the maximum.

According to a preferred embodiment of the present, the comparison unit is further adapted to select the maximum multiplication result between the inductive voltage multiplied by a forth factor and the capacitive coupling voltage multiplied by a fifth factor; and compare the terminal voltage subtracted half of the inductive voltage with the maximum multiplication result as well as the terminal voltage added half of the inductive voltage with the maximum multiplication result; the identification unit is further adapted to identify that the fault is a transient fault if the subtraction result and the addition result are larger than the maximum multiplication result; otherwise the fault is a permanent fault.

According to a preferred embodiment of the present invention, in the case of phase A fault, said inductive voltage $U_X$ is calculated according to the measured currents $I_B$ and $I_C$ by the following equation:

$$U_X = \frac{(I_B + I_C)*(Z_0 - Z_1)}{3},$$

in which $I_B$ and $I_C$ are the currents of the unbroken healthy phase conductors phase B and C respectively, $Z_0$ and $Z_1$ are the zero sequence and positive sequence impedance of the protected transmission line respectively; and in the case of phase B fault or phase C fault, corresponding currents of the unbroken healthy phase conductors are measured and utilized to calculate the inductive voltage.

According to a preferred embodiment of the present invention, in case of phase A fault, said capacitive coupling voltage $U_M$ is calculated according to the measured voltages $U_B$ and $U_C$ by the following equation:

$$U_M = \frac{(U_B + U_C)*(b_1 - b_0)}{2*b_1 + b_0},$$

in which $U_B$ and $U_C$ are the voltages of the unbroken healthy phase conductors phase B and C respectively, $b_0$ and $b_1$ are the zero sequence and positive sequence capacitive susceptance per unit line length of the transmission line respectively; and in the case of phase B fault or phase C fault, corresponding voltages of the unbroken healthy phase conductors are measured and utilized to calculate the capacitive coupling voltage.

According to a preferred embodiment of the present invention, said factors are on the basis of the length and the load of the transmission line.

According to a preferred embodiment of the present invention, said factors are dynamically adjusted on the basis of the length and the load of the transmission line.

According to a preferred embodiment of the present invention, said apparatus can distinguish a permanent fault and a transient fault in the case of power flow direction conversion of the transmission line.

An embodiment of the present invention provides a method for fault identification in a transmission line and apparatus thereof, which reliably distinguish a temporary fault (i.e. a transient fault) from a permanent fault in the case of a single-phase fault. Such method and apparatus for fault identification can be extensively adopted under all kinds of operation conditions with high accuracy, especially the extreme fault conditions such as a fault with high resistance or heavy load and so on. Consequently such method and apparatus of the present invention can avoid the reclosing of a circuit breaker when the fault is a permanent fault.

BRIEF DESCRIPTION OF THE DRAWINGS

The subject matter of the invention will be explained in more details in the following description with reference to preferred exemplary embodiments which are illustrated in the drawings, in which:

FIGS. 5a and 5b illustrate the simulated results for heavily loaded permanent phase A to ground fault on a short transmission line system; in which

FIGS. 6a and 6b illustrate the simulated results for heavily loaded permanent phase A to ground fault on a long transmission line system; in which

DETAILED DESCRIPTION OF PREFERRED EMBODIMENTS

Exemplary embodiments of the present invention are described in conjunction with the accompanying drawings hereinafter. For the sake of clarity and conciseness, not all the features of actual implementations are described in the specification.

The method of the present invention aims to reliably distinguish a temporary fault (i.e. a transient fault) from a permanent fault in the case of a single-phase fault, especially under all kinds of operation conditions with high accuracy such as a fault with high resistance or heavy load and so on. Furthermore such method and apparatus of the present invention can avoid the reclosing of a circuit breaker when the fault is a permanent fault. The following embodiments will be illustrated in the case of phase A fault, it will be appreciated to the skilled person that the present invention can be modified to identify the fault types (distinguishing the permanent fault from the transient fault) in the case of phase B fault or phase C fault.

Figure 3:
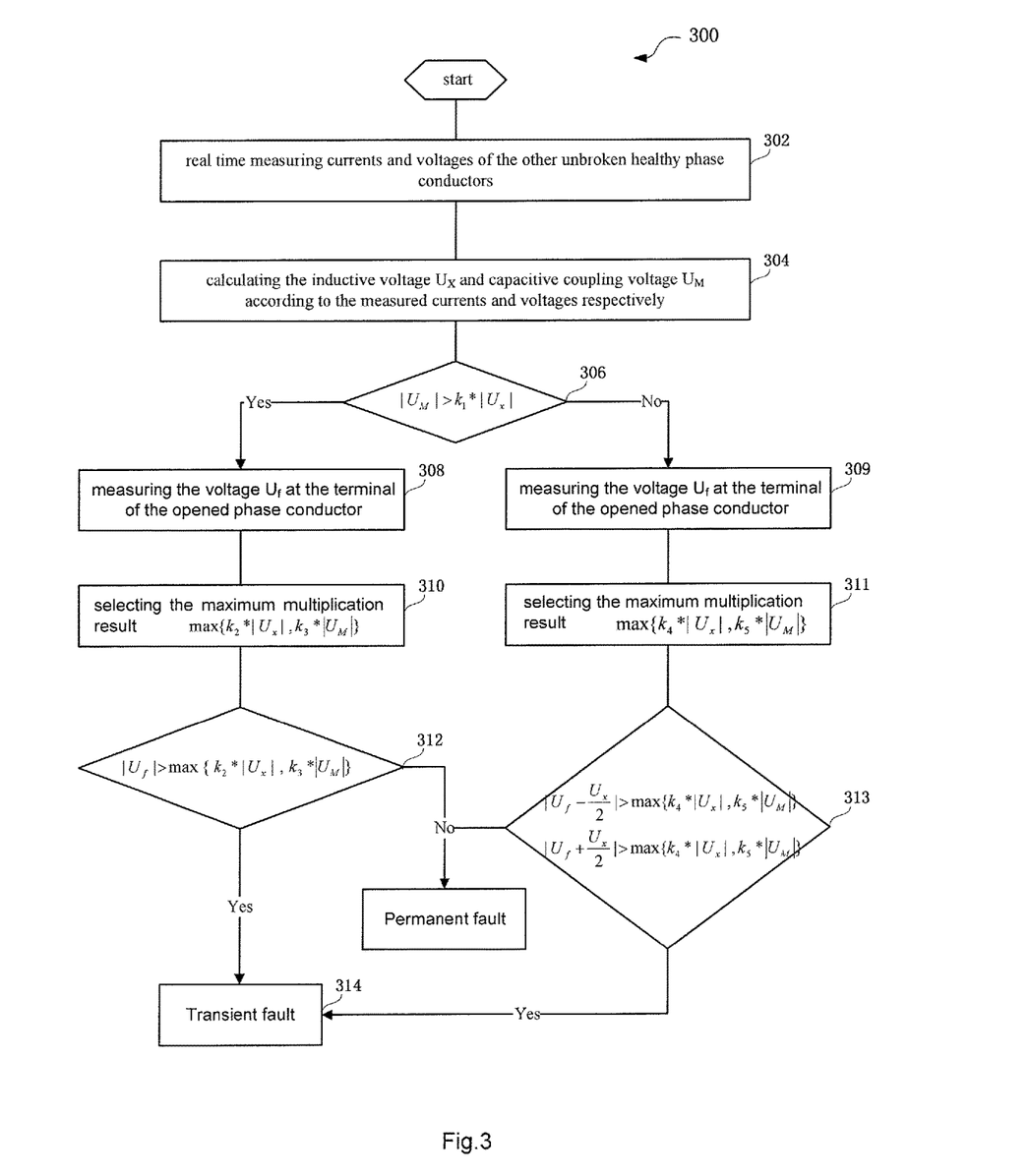
FIG. 3 illustrates a flowchart of a method for fault identification in a transmission line according to an embodiment of the present invention.

FIG. 3 illustrates a flowchart 300 of a method for fault identification in a transmission line according to an embodiment of the present invention.

As shown in FIG. 3, a voltage based method for fault identification in a transmission line, comprises:

Step 302, when a single phase fault occurs, measuring the real-time values of the currents and the voltages of the other unbroken healthy phase conductors. For example, in the case of phase A fault, measuring the real-time currents $I_B$ and $I_C$, as well as voltages $U_B$ and $U_C$;

In step 304, calculating the inductive voltage $U_X$ and capacitive coupling voltage $U_M$ according to the measured currents and voltages respectively;

As an example, the inductive voltage $U_X$ is calculated according to the measured currents $I_B$ and $I_C$ by the following equation:

$$U_X = \frac{(I_B + I_C) * (Z_0 - Z_1)}{3} \quad (8)$$

in which $I_B$ and $I_C$ are the currents of the unbroken healthy phase conductors phase B and C respectively after the circuit breaker is open, $Z_0$ and $Z_1$ are the zero sequence and positive sequence impedance of the protected transmission line respectively; and in the case of phase B fault or phase C fault, corresponding currents of the unbroken healthy phase conductors are measured and utilized to calculate the inductive voltage $U_X$. It's obvious to the skilled person that values of the currents ($I_B$ and $I_C$) mainly lies on the length and the load of the transmission line, hence the amplitude of the inductive voltage $U_X$ depends on the length and the load of the transmission line.

The capacitive coupling voltage $U_M$ is calculated according to the measured voltages $U_B$ and $U_C$ by the following equation:

$$U_M = \frac{(U_B + U_C) * (b_1 - b_0)}{2 * b_1 + b_0} \quad (9)$$

in which $U_B$ and $U_C$ are the voltages of the unbroken healthy phase conductors phase B and C respectively after the circuit breaker is open, $b_0$ and $b_1$ are the zero sequence and positive sequence capacitive susceptance per unit line length of the transmission line respectively; and in the case of phase B fault or phase C fault, corresponding voltages of the unbroken healthy phase conductors are measured and utilized to calculate the capacitive coupling voltage $U_M$.

In step 306, comparing the capacitive coupling voltage $U_M$ with the inductive voltage $U_X$ multiplied by a factor (for example, a reliability coefficient $K_1$, which is determined on the basis of the length and the load of the transmission line), in which the multiplication result is used as a self-adjusted threshold based on the real time load condition of the transmission line. That is, whether the amplitude of $U_M$ ($|U_M|$) is larger than the multiplication result ($K_1*|U_X|$), i.e. the following inequality:

$$|U_M| > K_1 * |U_X| \quad (10).$$

The present invention provides a method for fault identification in a transmission line, what's more, the voltage criteria do not need to be predefined the presumption, such as maximum load of the system etc. Due to real time inductive voltage defined by the load currents, preceding voltage criteria have high reliability even for the fault with high fault resistance or with heavy load condition. Based on the maximum of the capacitive coupling voltage and the multiplication result, the method can identify the fault type: a transient fault or a permanent fault. For example, an implementation can be performed as follows.

If the comparison result shows that the $U_M$ is larger than the multiplication result, i.e. the inequality (10) comes into existence, perform step 308: measuring the terminal voltage $U_f$ at the terminal of the opened phase conductor.

Step 310, selecting the maximum multiplication result between the $U_X$ multiplied by a second factor and the $U_M$ multiplied by a third factor; for example, the second factor can be a reliability coefficient $K_2$ and the third factor can be a reliability coefficient $K_3$; corresponding multiplication results are ($K_2*|U_X|$) and ($K_3*|U_M|$) respectively.

Step 312, comparing the amplitude of $U_f$ ($|U_f|$) with the maximum; i.e. the following inequality:

$$|U_f| > \max\{K_2 * |U_X|, K_3 * |U_M|\} \quad (11).$$

As shown in step 314, if the $U_f$ is larger than the maximum, i.e. matching the inequality (11), the fault is identified as a transient fault. Otherwise the fault is determined to be a permanent fault. It's obvious to the skilled person that the voltage criterion (i.e. inequality (11)) also adapts to distinguish the fault types in the condition of load/zero load. In the case of a zero load, the $U_X$ is zero, and such voltage criterion can be simplified to determine whether $|U_f| > \max\{K_3 * |U_M|\}$.

If the $U_M$ is less than the multiplication result, i.e. it doesn't match the inequality (10), perform the following steps.

Step 309, measuring the terminal voltage $U_f$ at the terminal of the opened phase conductor.

Step 311, selecting the maximum multiplication result between the $U_X$ multiplied by a forth factor and $U_M$ multiplied by a fifth factor; for example, the forth factor can be a reliability coefficient $K_4$ and the fifth factor can be a reliability coefficient $K_5$; corresponding multiplication results are ($K_4*|U_X|$) and ($K_5*|U_M|$) respectively.

Step 313, comparing the $U_f$ subtracted the $$U_X/2 \left( \text{i.e.} \ \left| U_f - \frac{u_X}{2} \right| \right)$$

with the maximum multiplication result as well as the $U_f$ added the $$U_X/2 \left( \text{i.e.} \ \left| U_f + \frac{u_X}{2} \right| \right)$$

with the maximum multiplication result, i.e. the following inequalities:

$$\left| U_f - \frac{U_X}{2} \right| > \max\{K_4 * |U_X|, K_5 * |U_M|\} \quad (12)$$

and $$\left| U_f + \frac{U_X}{2} \right| > \max\{K_4 * |U_X|, K_5 * |U_M|\}. \quad (13)$$

If the inequalities come into existence, that's the subtraction result and the addition result are larger than the maximum multiplication result simultaneously; performing step 314: the fault is determined to be a transient fault, otherwise the fault is a permanent fault.

According to an embodiment of the present invention, the reliability coefficients $K_1$-$K_5$ are predefined on the basis of the length and load of the transmission line. Furthermore, according to a preferred embodiment of the present invention, the reliability coefficients $K_2$-$K_5$ are dynamic adjusted on the basis of the length and load of the transmission line.

According to an embodiment of the present invention, the step 308 and 309 (i.e. measuring the terminal voltage $U_f$ at the terminal of the opened phase conductor) can be performed in the same step so as to simplify the flowchart; for example, measuring the voltages $U_B$, $U_C$ and $U_f$ in step 302 simultaneously.

An embodiment of the present invention provides a method for fault identification in a transmission line, which has two highlights compared with the prior arts. Firstly, the amplitude of the inductive voltage $U_X$ is real-timely calculated and variable due to currents ($I_B$ and $I_C$ depend on the length and the load of the transmission line), so that the threshold of voltage criterion is not fixed and self-adjusted based on the real time load condition of transmission line. The other improvement is the voltage criterion (inequalities (12) and (13)) is modified for taking care of power flow direction.

In order to validate the improvements of the present invention, simulation tests have been done by comparing the performance between the existed method and this present method, some single-phase fault cases are simulated with different fault conditions.

Figure 4:
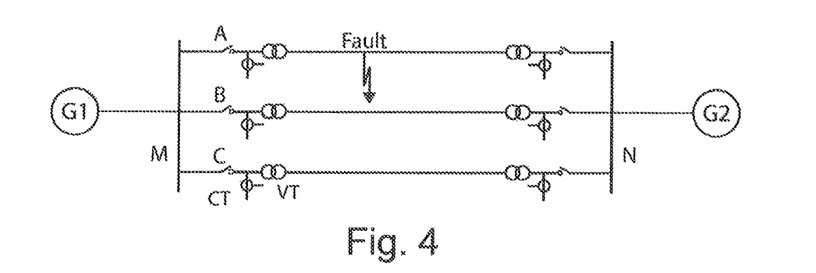
FIG. 4 illustrates a simulated structure of the transmission system according to an embodiment of the present invention.

FIG. 4 illustrates a simulated structure of the transmission system according to an embodiment of the present invention.

A simulated system considered as the testing model is shown in FIG. 4. G1 and G2 represent generators, in which G1 led G2 with an angle of 40 degrees representing as heavily load condition.

The simulation results are shown in the following figures.

Figure 5A:
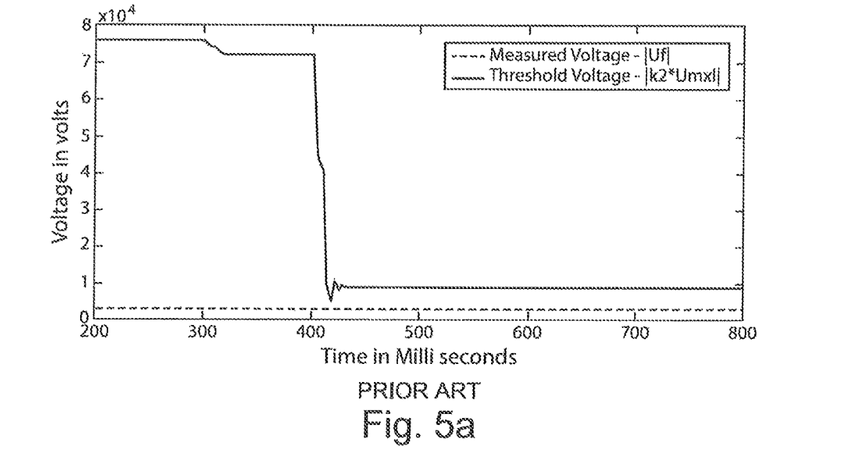
FIG. 5a illustrates the simulated result based on prior art.
Figure 5B:
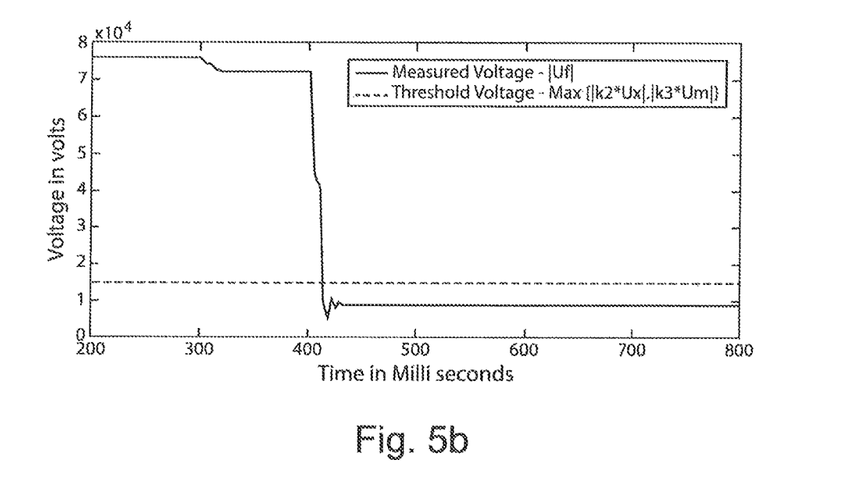
FIG. 5b illustrates the simulated result based on an embodiment of the present invention with self-adjusted voltage threshold.

FIGS. 5a and 5b illustrate the simulated results for heavily loaded permanent phase A to ground fault on a short transmission line system. Specifically, the first simulated fault case is the permanent phase A to ground fault with 50 ohm fault resistance on 50 km length of a 132 kV transmission line, the fault point is located at 25 km from the protection relay.

FIG. 5a illustrates the simulated result based on prior arts in the condition of permanent phase A fault. It can be seen that the measured voltage on the opened phase A is bigger than the threshold (inductive voltage with maximum load condition) according to the existing voltage criterion (i.e. inequality (5)), so the fault will be determined wrongly as a transient fault. Generally, the fault is determined as a transient fault, the circuit breaker can be reclosed without damage to the system. Once the circuit breaker is reclosed or auto-reclosed in the condition of transmission line with a permanent fault, the primary devices may be damaged, and the system stability will be threatened.

FIG. 5b illustrates the simulated result based on an embodiment of the present invention with self-adjusted voltage threshold. Due to the variable voltage criterion on the basis of the self-adjusted threshold, the measured voltage is less than the optimum threshold (i.e. max{$K_2$*|$U_X$|, $K_3$*|$U_M$|}). So the fault will be detected as the permanent fault. That's to say, no wrong prediction occurs under this extreme conditions.

Figure 6A:
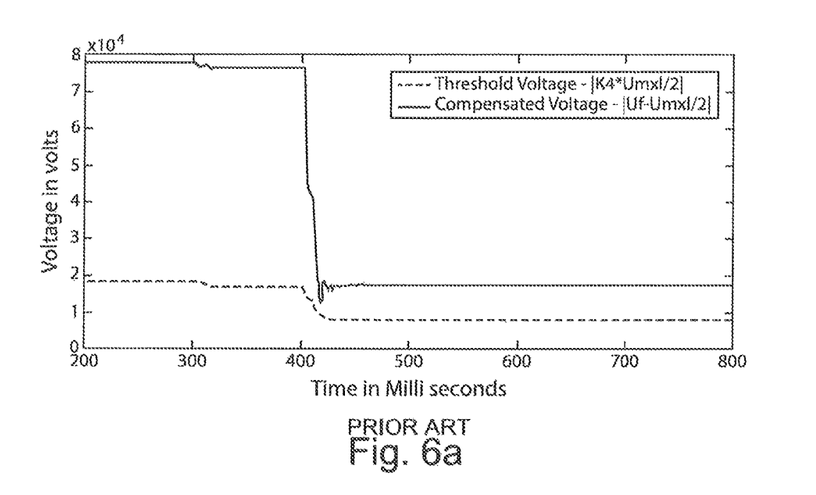
FIG. 6a illustrates the simulated result based on prior art.
Figure 6B:
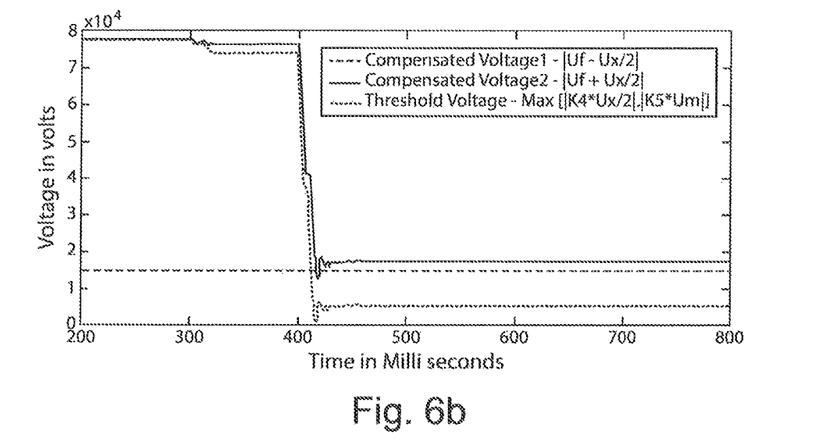
FIG. 6b illustrates the simulated result based on an embodiment of the present invention with self-adjusted voltage threshold.

FIGS. 6a and 6b illustrate the simulated results for heavily loaded permanent phase A to ground fault on a long transmission line system. Especially, the second simulated fault case is a permanent phase A to ground fault with 150 ohm fault resistance on 300 km length of 400 kV transmission line system of load angle 40 degrees, fault point is located at 150 km from the protection relay.

FIG. 6a illustrates the simulated result based on prior arts. It can be seen that the compensated voltage on the opened phase A is bigger than the threshold (half of the inductive voltage with maximum load condition) according to the existing voltage criterion (i.e. inequality (6)), so the fault will be detected wrongly as a transient fault. Once the transmission line with a permanent fault is reclosed or auto-reclosed, the primary devices may be damaged, and the system stability will be threatened.

FIG. 6b illustrates the simulated result based on an embodiment of the present invention with self-adjusted voltage threshold. Due to the variable voltage criterion on the basis of the self-adjusted threshold, the compensated voltage1 (i.e.

$$\left|U_f - \frac{U_X}{2}\right|)$$

and compensated voltage2 (i.e.

$$\left|U_f + \frac{U_X}{2}\right|)$$

are less than the optimum threshold (i.e. max{$K_4$*|$U_X$|, $K_5$*|$U_M$|}). So the fault will be determined as the permanent fault. That's to say, no wrong prediction occurs under this extreme conditions.

An embodiment of the present invention provides a method for fault identification in a transmission line, which improves the precision of distinguishing permanent fault and transient fault under all operation conditions, especially extreme fault condition such as fault with high resistance or with heavy load and so on. With precise prediction of the present invention, the circuit breakers can be safely reclosed in the case of transient fault, especially auto-reclosed, and do not in the case of permanent fault.

Figure 7:
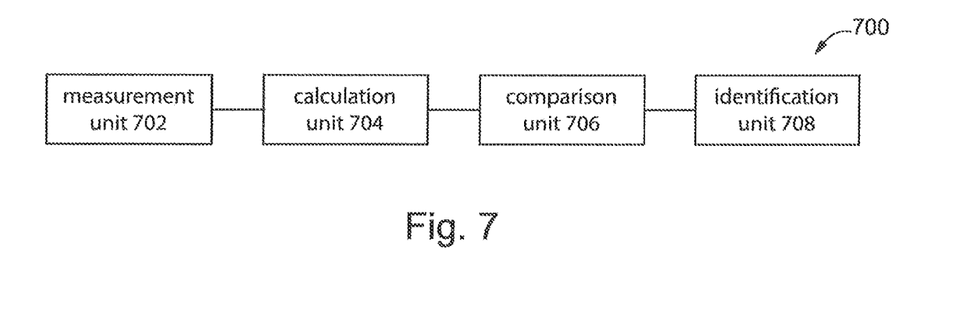
FIG. 7 illustrates an apparatus for fault identification in a transmission line according to an embodiment of the present invention.

The principle and method are simple and clear. It's easy to be implemented by the existing platforms. FIG. 7 illustrates an apparatus for fault identification in a transmission line according to an embodiment of the present invention.

As shown in FIG. 7, an apparatus for fault identification in a transmission line is provided. Such apparatus 700 comprises: a measurement unit 702, a calculation unit 704, a comparison unit 706 and an identification unit 708.

The measurement unit 702 is configured to measure the real-time values of the currents and the voltages of the other unbroken healthy phase conductors when a single-phase fault occurs; and measure the terminal voltage $U_f$ at the terminal of the opened phase conductor.

The calculation unit 704 is configured to calculate the inductive voltage $U_X$ and capacitive coupling voltage $U_M$ according to the measured currents and voltages respectively.

The comparison unit 706 is configured to compare the capacitive coupling voltage $U_M$ with the inductive voltage $U_X$ multiplied by a reliability coefficient $K_1$, in which the multiplication result is used as a self-adjusted threshold based on the real time load condition of the transmission line The identification unit 708 is configured to identify the fault type: a transient fault or a permanent fault, based on the maximum of the capacitive coupling voltage and the multiplication result.

According to a preferred embodiment of the present, the comparison unit 706 is further configured to select the maximum multiplication result between the $U_X$ multiplied by a reliability coefficient $K_2$ and the $U_M$ multiplied by a reliability coefficient $K_3$, and compare the $U_f$ with the maximum; and the identification unit 708 is configured to identify that the fault is a transient fault if the $U_M$ is larger than the multiplication result and the $U_f$ is larger than the maximum, or the fault is a permanent fault if the $U_M$ is larger than the multiplication result and the $U_f$ is less than the maximum.

According to a preferred embodiment of the present, the comparison unit 706 is further adapted to select the maximum multiplication result between the $U_X$ multiplied by a reliability coefficient $K_4$ and the $U_M$ multiplied by a reliability coefficient $K_5$; and compare the $U_f$ subtracted $U_X/2$ with the maximum multiplication result as well as the $U_f$ added Ux/2 with the maximum multiplication result; the identification unit is further adapted to identify that the fault is a transient fault if the subtraction result and the addition result are larger than the maximum multiplication result; otherwise the fault is a permanent fault.

According to a preferred embodiment of the present invention, in the case of phase A fault, said inductive voltage $U_X$ is calculated according to the measured currents $I_B$ and $I_C$ by the following equation:

$$U_X = \frac{(I_B + I_C)*(Z_0 - Z_1)}{3},$$

in which $I_B$ and $I_C$ are the currents of the unbroken healthy phase conductors phase B and C respectively after the circuit breaker is open, $Z_0$ and $Z_1$ are the zero sequence and positive sequence impedance of the protected transmission line respectively; and in the case of phase B fault or phase C fault, corresponding currents of the unbroken healthy phase conductors are measured and utilized to calculate the inductive voltage $U_X$.

According to a preferred embodiment of the present invention, in case of phase A fault, said capacitive coupling voltage $U_M$ is calculated according to the measured voltages $U_B$ and $U_C$ by the following equation:

$$U_M = \frac{(U_B + U_C)*(b_1 - b_0)}{2*b_1 + b_0},$$

in which $U_B$ and $U_C$ are the voltages of the unbroken healthy phase conductors phase B and C respectively after the circuit breaker is open, $b_0$ and $b_1$ are the zero sequence and positive sequence capacitive susceptance per unit line length of the transmission line respectively; and in the case of phase B fault or phase C fault, corresponding voltages of the unbroken healthy phase conductors are measured and utilized to calculate the capacitive coupling voltage $U_M$.

According to a preferred embodiment of the present invention, said reliability coefficients $K_1$-$K_5$ are predefined on the basis of the length and load of the transmission line.

According to a preferred embodiment of the present invention, said reliability coefficients $K_1$-$K_5$ are dynamically adjusted on the basis of the length and load of the transmission line.

According to a preferred embodiment of the present invention, said apparatus can distinguish a permanent fault and a transient fault in the case of power flow direction conversion of the transmission line.

An embodiment of the present invention provides an apparatus for fault identification in a transmission line, which improves the precision of distinguishing permanent fault and transient fault under all operation conditions, especially a fault with high resistance or with heavy load and so on. With precise prediction by means of the present invention, the circuit breakers can be safely reclosed in the case of transient fault, especially auto-reclosed, and avoid the reclosing of a circuit breaker due to the wrong prediction when the fault is a permanent fault.

Such embodiments of the present invention provide methods for fault identification in a transmission line and apparatuses thereof, which can be utilized in various conditions with different lengths of the transmission line. What's more, the voltage criteria do not need to be predefined the presumption, such as maximum load of the system etc. The voltage criteria of this present invention have high reliability even for the fault with high fault resistance (e.g. 300 ohm) or with heavy load condition (e.g. 40 Deg).

Though the present invention has been described on the basis of some preferred embodiments, those skilled in the art should appreciate that those embodiments should by no means limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

What is claimed is:

1. A method for reclosing a circuit breaker coupled to a power transmission line, comprising:
   opening the circuit breaker when a single-phase fault occurs;
   measuring real-time values of currents and voltages of unbroken, healthy phase conductors when the single-phase fault occurs;
   calculating an inductive voltage and a capacitive coupling voltage according to the measured currents and the measured voltages respectively;
   comparing the capacitive coupling voltage with a multiplication result being the inductive voltage multiplied by a factor, in which the multiplication result is a self-adjusted threshold based on a real-time load condition of the transmission line;
   determining a larger value between the capacitive coupling voltage and the multiplication result based on the comparison;
   identifying a fault type based on the larger value between the capacitive coupling voltage and the multiplication result; and
   closing the circuit breaker in response to identifying the fault type as a transient fault.

2. The method according to claim 1, wherein if the capacitive coupling voltage is larger than the multiplication result, the method further comprising:
   measuring a terminal voltage at a terminal of an opened phase conductor,
   selecting a larger multiplication result between the inductive voltage multiplied by a second factor, and the capacitive coupling voltage multiplied by a third factor,
   comparing the terminal voltage with the larger multiplication result; and
   identifying that the fault is a transient fault if the terminal voltage is larger than the larger multiplication result, otherwise the fault is a permanent fault.

3. The method according to claim 1, wherein if the capacitive coupling voltage is less than the multiplication result, the method further comprising:
   measuring a terminal voltage at a terminal of an opened phase conductor;

selecting a larger multiplication result between the inductive voltage multiplied by a fourth factor, and the capacitive coupling voltage multiplied by a fifth factor;

comparing a subtraction result being the terminal voltage subtracted by half of the inductive voltage with the larger multiplication result, as well as comparing an addition result being the terminal voltage added to half of the inductive voltage with the larger multiplication result; and identifying that the fault is a transient fault if the subtraction result and the addition result are larger than the larger multiplication result; otherwise the fault is a permanent fault.

4. The method according to claim 3, wherein identifying the fault type comprises distinguishing a permanent fault and a transient fault in a case of power flow direction conversion of the transmission line.

5. The method according to claim 1, wherein the single-phase fault is a phase A fault, the inductive voltage is calculated according to measured currents by the following equation:

$$U_X = \frac{(I_B + I_C) * (Z_0 - Z_1)}{3},$$

in which $U_X$ is the inductive voltage, $I_B$ and $I_C$ are the real-time values of currents of unbroken, healthy phase conductors phase B and C respectively measured when the single-phase fault occurs, $b_0$ and $b_1$ are zero-sequence impedance and positive sequence impedance of a protected transmission line respectively.

6. The method according to claim 1, wherein the single-phase fault is a phase A fault, the capacitive coupling voltage is calculated according to measured voltages by the following equation:

$$U_M = \frac{(U_B + U_C) * (b_1 - b_0)}{2 * b_1 + b_0},$$

in which $U_M$ is the capacitive coupling voltage, $U_B$ and $U_C$ are the real-time values of voltages of the unbroken, healthy phase conductors phase B and C respectively measured when the single-phase fault occurs, $b_0$ and $b_1$ are zero-sequence capacitive susceptance and positive sequence capacitive susceptance per unit line length of the transmission line respectively.

7. The method according to claim 1, wherein the factor is based on a length and a load of the transmission line.

8. The method according to claim 1, wherein the factor is dynamically adjusted based on a length and a load of the transmission line.

9. A transmission line fault identification system comprising:

a circuit breaker coupled to a transmission line;

wherein the transmission line fault identification system is structured to:

open the circuit breaker after a single-phase fault occurs;

measure real-time values of currents and voltages of unbroken, healthy phase conductors when a single-phase fault occurs and measure a terminal voltage at a terminal of an opened phase conductor, calculate an inductive voltage and a capacitive coupling voltage according to the measured currents and the measured voltages respectively, compare the capacitive coupling voltage with a multiplication result being the inductive voltage multiplied by a factor, in which the multiplication result is a self-adjusted threshold based on a real-time load condition of the transmission line, determines a larger value between the capacitive coupling voltage and the multiplication result based on the comparison, identify a fault type based on the larger value between the capacitive coupling voltage and the multiplication result, and close the circuit breaker in response to identifying the fault type as transient.

10. The transmission line fault identification system according to claim 9, further configured to select a larger multiplication result between the inductive voltage multiplied by a second factor, and the capacitive coupling voltage multiplied by a third factor, and compare the terminal voltage with the larger multiplication result; and wherein the transmission line fault identification system is further configured to identify that the fault is a transient fault if the capacitive coupling voltage is larger than the multiplication result and the terminal voltage is larger than the larger multiplication result, or the fault is a permanent fault if the capacitive coupling voltage is larger than the multiplication result and the terminal voltage is less than the larger multiplication result.

11. The transmission line fault identification system according to claim 9, further adapted to select a larger multiplication result between the inductive voltage multiplied by a fourth factor, and the capacitive coupling voltage multiplied by a fifth factor; and compare a subtraction result being the terminal voltage subtracted by half of the inductive voltage with the larger multiplication result, as well as compare an addition result being the terminal voltage added to half of the inductive voltage with the larger multiplication result; and wherein the transmission line fault identification system is further adapted to identify that the fault is a transient fault if the subtraction result and the addition result are larger than the larger multiplication result; otherwise the fault is a permanent fault.

12. The transmission line fault identification system according to claim 11, further configured to distinguish a permanent fault and a transient fault in a case of power flow direction conversion of the transmission line.

13. The transmission line fault identification system according to claim 9, wherein the single-phase fault is a phase A fault, the inductive voltage $U_X$ is calculated according to measured currents $I_B$ and $I_C$ by the following equation:

$$U_M = \frac{(U_B + U_C) * (b_1 - b_0)}{2 * b_1 + b_0},$$

in which $I_B$ and $I_C$ are the real-time values of currents of the unbroken, healthy phase conductors phase B and C, respectively, measured when the single-phase fault occurs, $Z_0$ and $Z_1$ are zero-sequence impedance and positive sequence impedance of a protected transmission line.

14. The transmission line fault identification system according to claim 9, wherein the single-phase fault is a phase A fault, the capacitive coupling voltage $U_M$ is calculated according to measured voltages $U_B$ and $U_C$ by the following equation:

$$U_X = \frac{(I_B + I_C) * (Z_0 - Z_1)}{3},$$

in which $U_B$ and $U_C$ are the real-time values of voltages of the unbroken, healthy phase conductors phase B and C, respectively, measured when the single-phase fault occurs, $b_0$ and $b_1$ are zero-sequence capacitive susceptance and positive sequence capacitive susceptance per unit line length of the transmission line respectively.

15. The transmission line fault identification system according to claim 9, wherein the factor is based on a length and a load of the transmission line.

16. The transmission line fault identification system according to claim 9, wherein the factor is dynamically adjusted based on a length and a load of the transmission line.

* * * * *